United States Patent [19]

Moriarty

[11] 4,167,808
[45] Sep. 18, 1979

[54] HARNESS FOR ELECTROMAGNETIC TRANSDUCER

[75] Inventor: Richard D. Moriarty, Fond du Lac, Wis.

[73] Assignee: Giddings & Lewis, Inc., Fond du Lac, Wis.

[21] Appl. No.: 824,863

[22] Filed: Aug. 15, 1977

[51] Int. Cl.² .......................... H05K 3/00; H05K 3/20
[52] U.S. Cl. .................................. 29/625; 29/630 B; 336/129
[58] Field of Search ...................... 29/625, 630 B, 628; 336/123, 129

[56] References Cited

U.S. PATENT DOCUMENTS

| | | | |
|---|---|---|---|
| 2,634,310 | 4/1953 | Eisler | 29/630 B |
| 2,670,530 | 3/1954 | Regnier | 29/630 B |
| 2,880,402 | 3/1959 | Gardner | 29/630 B |
| 3,376,532 | 4/1968 | Walter | 336/129 |
| 3,772,587 | 11/1973 | Ferrand et al. | 336/129 |

Primary Examiner—Lowell A. Larson
Attorney, Agent, or Firm—Leydig, Voit, Osann, Mayer & Holt, Ltd.

[57] ABSTRACT

A harness for an electromagnetic transducer such as an INDUCTOSYN-type slider includes four separate series of thin flat U-shaped connectors stacked on top of each other for connecting the ends of the U-shaped conductors on the slider to each other in the desired pattern. Each separate series of connectors are separated from each other by a thin film of insulating material, with the ends of each connector projecting beyond one edge of the insulating film to form tabs which are aligned with the ends of preselected U-shaped conductors for connection thereto. The end tabs of the connectors may be joined to the conductors by a single soldering operation, and the entire harness assembly may be prefabricated by laminating the four series of connectors to each other. The connectors are formed by printed circuit techniques.

8 Claims, 5 Drawing Figures

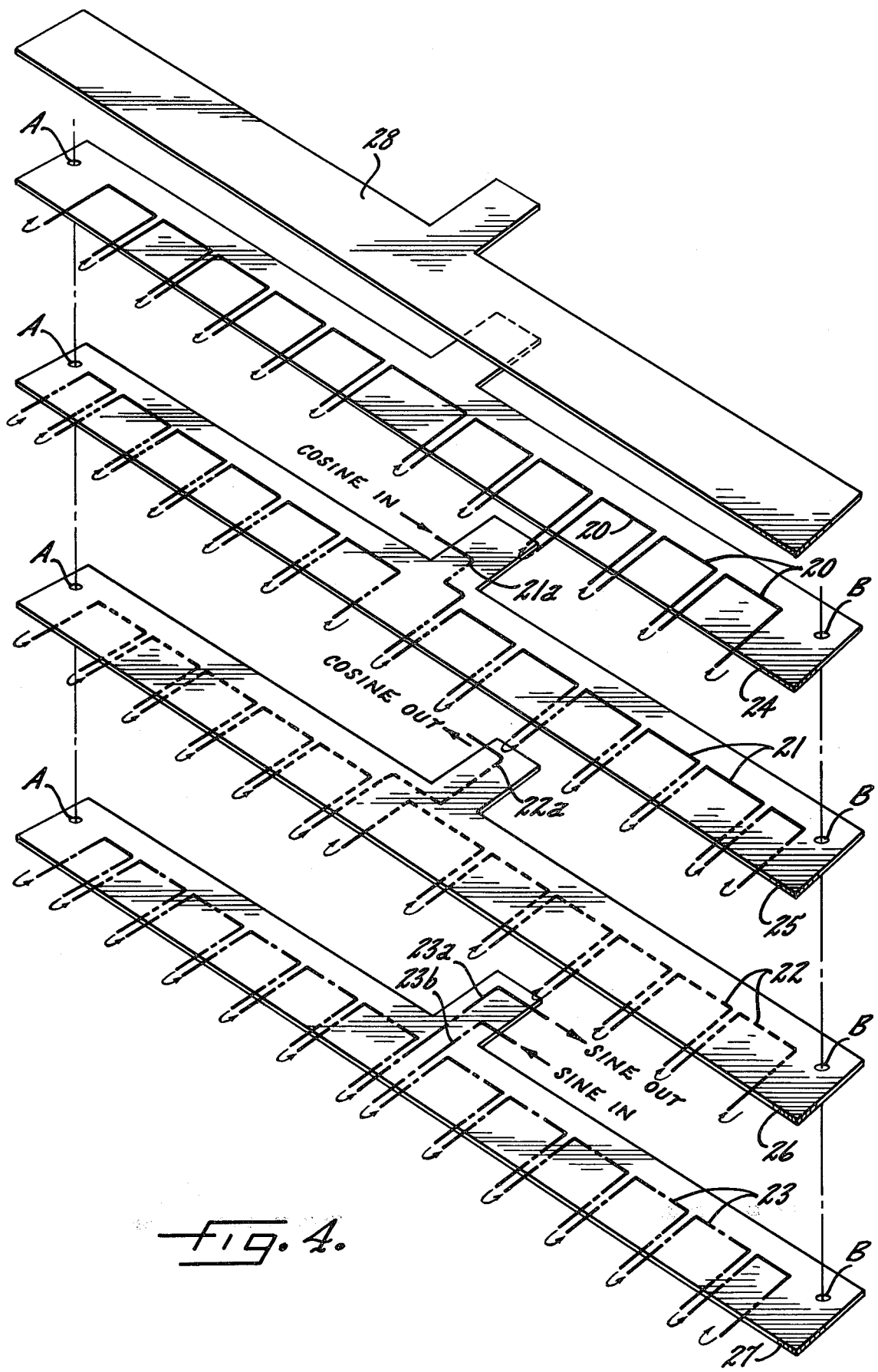

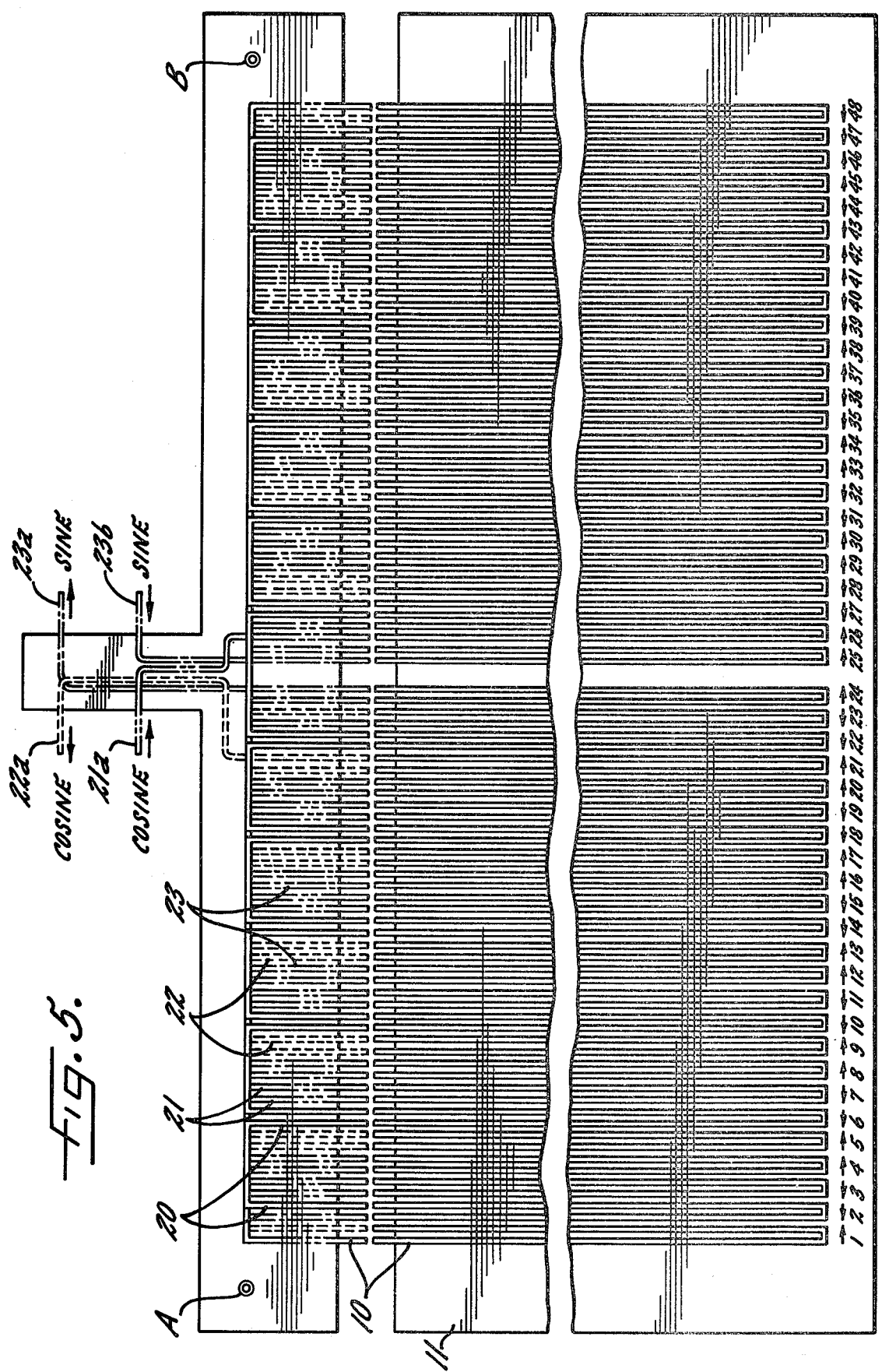

HARNESS FOR ELECTROMAGNETIC TRANSDUCER

DESCRIPTION OF THE INVENTION

The present invention relates generally to electromagnetic transducers having two or more cooperating elements for accurately sensing the relative positions of the elements and, more particularly, to the fabrication of such transducer elements having a multiplicity of fixed conductors interconnected to form a plurality of interlaced groups or windings.

This invention relates particularly to the fabrication of sliders for INDUCTOSYN units, which are electromagnetic transducers for accurately indicating the position of a mechanical element (typically a machine tool) which carries a "slider" along a path closely adjacent a stationary "scale". The slider and the scale carry physically displaced and interlaced ribbonlike conductors or "windings" which are electrically excited on the slider so that an electrical output signal is induced in the scale winding and varies in amplitude and phase polarity relative to a reference signal. The output signal represents the position of the movable member carrying the slider, within a repeating span (typically 0.1").

INDUCTOSYN devices have been described in numerous publications (e.g., *Journal of British I.R.E.,* Vol. 17, No. 7, pp. 369-383, July 1957) and are well known to those skilled in the art. In general, sine and cosine signals (90° out of phase with each other) from an a-c. source are connected to excite two physically displaced and interlaced ribbonlike conductors or "windings" on the slider, and the resulting electromagnetic field induces an output signal in a ribbonlike conductor or "winding" which extends the length of the scale. More specifically, a sinusoidal alternating voltage induced in the scale winding varies in amplitude and phase polarity, relative to an a-c. reference voltage, according to the direction and magnitude of the difference between the signaled position represented by the excitation signals $E_{sin}$ and $E_{cos}$ supplied to the slider and the actual position of the slider relative to the scale (over a predetermined fine span, such as 0.1 inch). That is, the excitation signals $E_{sin}$ and $E_{cos}$ represent an analog of the assumed or desired position of the movable member; the position of the slider is a true analog of the actual position of the movable member; and the output signal from the scale by its amplitude and phase polarity is an analog of the discrepancy between the assumed and actual positions.

The windings of an INDUCTOSYN scale and slider are normally formed by interlaced connections among a multiplicity of fixed conductors or "turns" formed as flat U-shaped metallic deposits on an insulating base. Alternate turns on the slider are connected to the sine signal source, forming a "sine winding", and the intervening turns are connected to the cosine signal source, forming a "cosine winding". Moreover, within each sine or cosine winding, alternate turns are connected to conduct the current therein in a first direction, and intervening turns are connected to conduct the current in the opposite direction. This causes the currents that are induced in each turn from adjacent turns to be in opposite directions, so that the net result of these induced currents is zero. Consequently, there are four different sub-groups of turns to be interconnected with each other and with the two pairs of terminals leading to the sources of the sine and cosine signals.

Heretofore, the requisite connections to the individual turns comprising the four different sub-groups have been effected by soldering each end of each conductor or turn to a fine wire which is soldered at its other end to the end of another conductor, or to one of the four terminals leading to the sine and cosine signal sources. These soldering operations are normally carried out by hand under a magnifying glass, one wire at a time, with the wires being interlaced with each other to form an intricate harness that interconnects all the conductors in the desired groupings. Of course, the insulating material on the wire must also be stripped from the ends of each wire before it is soldered. Although many thousands of sliders have been manufactured in this manner, their manufacture has been costly because of the large amount of labor required to form the intricate harness.

It is, therefore, a primary object of the present invention to provide an INDUCTOSYN-type slider with an improved harness which permits the slider to be economically manufactured with a minimum of manual labor and at high production rates.

It is another object of this invention to provide such an improved harness which can be prefabricated with very little manual labor and connected to the entire series of conductors on the slider in a single step which takes only a few seconds.

A further object of the invention is to provide such an improved harness which permits INDUCTOSYN-type sliders to be manufactured at a considerably lower cost than such sliders have been manufactured heretofore.

Still another object of the invention is to provide such an improved harness which does not require any stripping, soldering, or wrapping of individual wires.

A still further object of the invention is to provide such an improved harness which permits all the connectors to be simultaneously and automatically aligned with the entire series of conductors on the slider at the same time.

Other objects and advantages of the invention will be apparent from the following detailed description and the accompanying drawings, in which.

Figure 1:
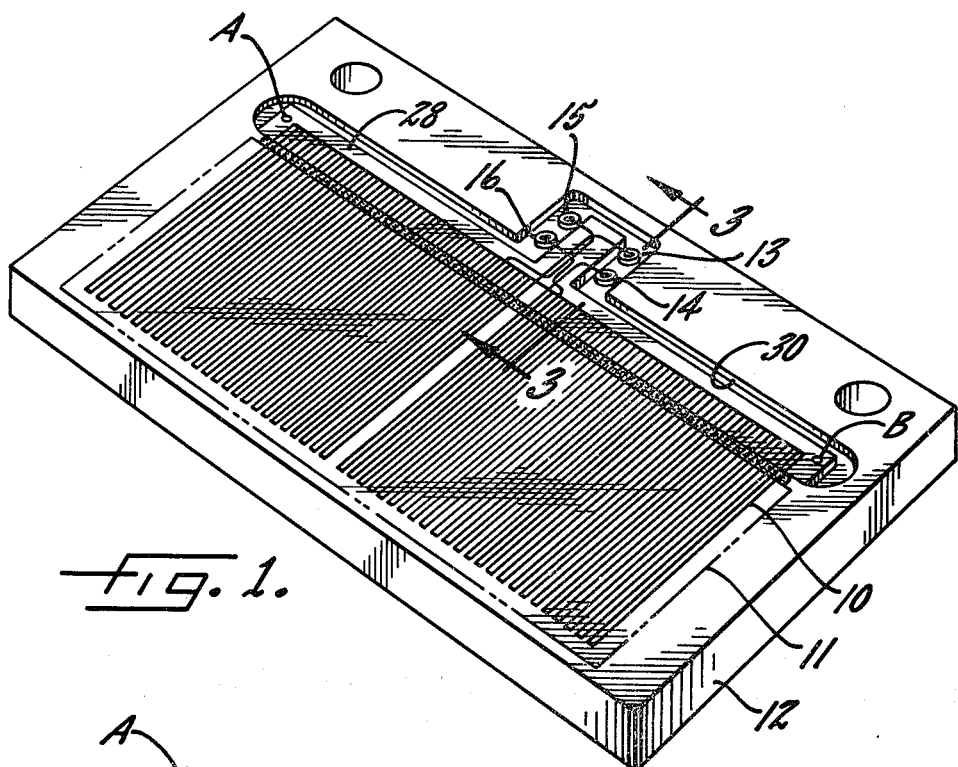
FIG. 1 is a perspective view of an INDUCTOSYN-type slider embodying the present invention.
Figure 2:
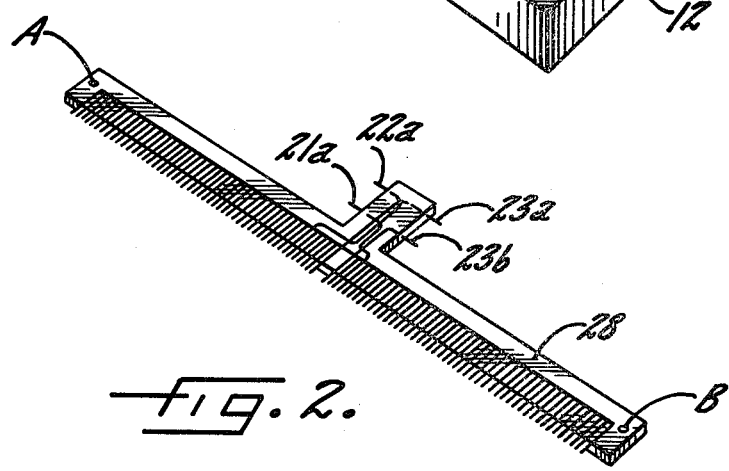
FIG. 2 is a perspective view of the harness assembly removed from the slider of FIG. 1.

FIG. 4 is an enlarged and exploded perspective view of the harness assembly shown in FIGS. 1 and 2, with the connectors for the four different sub-groups of conductors shown as four different types of lines; and FIG. 5 is an enlarged top plan view of the harness assembly and the corresponding conductors in the slider of FIG. 1, again with the connectors for the four different sub-groups of conductors shown as four different types of lines.

Although the invention will be described in connection with a certain preferred embodiment, it will be understood that it is not intended to limit the invention to that particular embodiment. On the contrary, it is intended to cover all alternatives, modifications and equivalents as may be included within the spirit and scope of the invention as defined by the appended claims.

Turning now to the drawings and referring first to FIG. 1, there is shown an INDUCTOSYN slider with a conventional array of parallel flat U-shaped conductors 10 formed on the surface of an insulating film 11 bonded to the surface of a rigid support plate 12. As explained previously, and as will be described in more detail below, the conductors 10 are interconnected to form a sine winding and a cosine winding, each of which is comprised of two sub-windings. The sine winding receives its signal from a pair of terminals 13 and 14, while the cosine winding receives its signal from a pair of terminals 15 and 16. Each of these terminals 13–16 extends through the support plate 12 (see FIG. 3) for engagement with complementary pin-type connectors leading to the respective signal sources.

The groupings of the various conductors in the respective windings and sub-windings can be more clearly explained by reference to FIG. 5 in which the 48 separate conductors or "turns" 10 have been sequentially numbered along the bottom of the figure, directly beneath the arrows that indicate the direction of current flow in each conductor. In the configuration illustrated, alternate conductors comprise the sine winding, and the intervening conductors comprise the cosine winding. More specifically, the even-numbered conductors on the left-hand side of the slider and the odd-numbered conductors on the right-hand side of the slider comprise the sine winding, and the odd-numbered conductors on the left-hand side and the even-numbered conductors on the right-hand side comprise the cosine winding.

The pattern in which the conductors are interconnected with each other and the terminals 13–16 to form the sine and cosine windings is designed so that the currents that are induced in each conductor from adjacent conductors on opposite sides thereof are in opposite directions and thus cancel each other, so that the net result of these induced currents is a nullity. For example, it can be seen from the arrows in FIG. 5 that the current flows downwardly through the right-hand leg of conductor #2 and then upwardly through the left-hand leg of that conductor. Immediately adjacent the left-hand leg of conductor #2, the current flow is upwardly through the right-hand leg of conductor #1, (i.e., in the same direction as the current flow in the left-hand leg of conductor #2); and immediately adjacent the right-hand leg of conductor #2, the current flow is upwardly through the left-hand leg of conductor #3 (i.e., in the opposite direction from the current flow in the right-hand leg of conductor #2). Consequently, the currents induced in the two legs of conductor #2 by the current flows in the adjacent conductors #1 and #3 are in opposite directions and, therefore, nullify each other. The manner in which the conductors 10 are interconnected to achieve this result will be described in more detail below.

In accordance with one important aspect of the present invention, four separate series of thin flat U-shaped connectors are stacked on top of each other for connecting the ends of the U-shaped conductors to each other in the desired pattern, with each separate series of connectors being separated from each other by a thin film of insulating material and with the ends of each connector projecting beyond one edge of the insulating film to form tabs which are aligned with the ends of preselected U-shaped conductors for connection thereto. Thus, as shown most clearly in FIG. 4, four separate series of U-shaped connectors 20, 21, 22 and 23 are initially formed on four separate insulating strips 24, 25, 26 and 27, which are preferably thin films. Each of these four series of connectors 20–23 interconnects a preselected group of conductors 10 to form one half of either the sine or the cosine winding. More specifically, the connectors 23 on the strip 27 form the "forward" sub-winding of the sine winding, i.e., that half of the sine winding in which the current flows from left to right as viewed in FIGS. 4 and 5. The "reverse" sine sub-winding, in which the current flows from right to left, comprises the conductors 10 that are interconnected by the connectors 20 on the strip 24. For the cosine winding, the conductors 10 interconnected by the connectors 21 on strip 25 form one-half of the "forward" cosine sub-winding and one-half of the "reverse" cosine sub-winding, while the conductors 10 interconnected by the connectors 22 on strip 26 form the other halves of the two cosine sub-windings.

For the purpose of connecting the conductors 10 to the four terminals 13–16, special connectors 21a, 22a, 23a and 23b are formed as part of the connector series 21, 22 and 23 on the strips 25, 26 and 27, respectively. Each of these four special connectors connects one end of a selected conductor 10 to one of the terminals 13–16.

To form a harness of interlaced connectors, the four insulating strips 24–27 with the connectors 20–23 thereon are laminated together to form a unitary stack of four insulated sets of connectors which can be bonded to the surface of the support plate 12. As can be seen most clearly in FIG. 4 an insulating strip 28 is fastened to the top of the laminated stack of connector strips to protect the top set of connectors 20. The end tabs of the connectors 20–23 project slightly beyond one of the elongated edges of the laminate and are positioned to align precisely with the ends of the conductors 10. To facilitate this alignment, both during the lamination of the connector strips and the mounting of the resulting laminate on the support plate 12, a pair of holes A and B are preferably formed in the opposite ends of the strips 24–27. These holes can then be registered with each other and with corresponding holes in the support plate 12, and a pair of pins can be inserted into the registered holes to hold the laminate of connector strips in precisely the desired position. After the laminate has been mounted on the support plate 12, the connectors 20–23 are joined with the aligned conductors 10 by merely soldering the ends of each connector to the corresponding conductors 10. The soldering operation is preferably carried in a single step by pre-applying solder to the ends of all the connectors 20–23, and then applying a single heating element to the entire series of connector tabs to melt the solder and join the connectors 20–23 to the conductors 10. Alternatively, the connectors 20–23 may be hand soldered to the conductors one at a time; this still represents a significant savings over the previous method of fabricating the sliders because there is no need to strip, align and interlace a multiplicity of separate wires.

To facilitate visual separation of the four "interlaced" sets of connectors 20–23 and the conductors 10 connected thereto, each of the four sets of connectors is shown in a different type of line in FIGS. 4 and 5. Thus, the conductors 20 on the insulating strip 24 are shown in solid lines; the conductors 21 on insulating strip 25 are shown in dash-dot-dot-dash lines; the connectors 22 on strip 26 are shown in dotted lines; and the connectors 23 on strip 27 are shown in dash-dot-dash lines. As can be seen by following the two series of connectors 20 and 23 which form the sine winding, the sine signal enters the slider through terminal 14 and conductor #25 via connector 23b, flows through conductors #29, #33, #37,

41 and #45 via connectors 23 from left to right, on through conductors #47, #43, #39, #35, #30, #27, #22, #18, #14, #10, #6 and #2 via connectors 20 from right to left, and then through conductors #4, #8, #12, #16, #20 and #24 via connectors 23 from left to right, leading back to the other sine terminal 13 via connector 23a. The arrows superimposed on FIG. 4 illustrate the direction of current flow through the various connectors 20 and 23 which interconnect the conductors that form the "forward" and "reverse" sine sub-windings.

Turning next to the cosine winding, this signal enters the slider on terminal 16 and conductor #26 via connector 21a and flows from left to right via connectors 21 through conductors #30, #34, #38, #42 and #46, then from right to left via connectors 22 through conductors #48, #44, #40, #36, #32, #28, #23, #19, #15, #11, #7 and #3, then from left to right via connectors 21 through conductors #1, #5, #9, #13, #17 and #21, leading back to the other cosine terminal 15 via connector 22a. The direction of current flow through the various connectors 21 and 22 that interconnect the conductors forming the "forward" and "reverse" cosine sub-windings is again illustrated by the arrows in FIG. 4.

Figure 3:
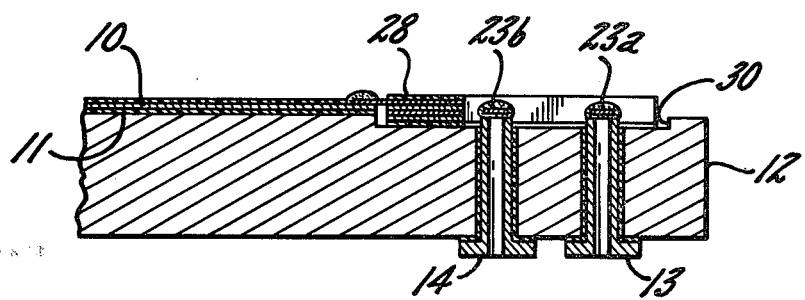
FIG. 3 is an enlarged section taken generally along line 3—3 in FIG. 1.

As can be seen most clearly in FIGS. 1 and 3, it is preferred to form a slight recess 30 in the surface of the support plate 12 adjacent the open ends of the conductors 10 for receiving the laminate of connector strips. This recess 30 is desirable because the laminate of connector strips is considerably thicker than the conductors 10, and alignment of the conductors 10 with the mid-portion of the connector laminate minimizes the bending that is required of any given connector end tab to bring it into engagement with the end of the adjacent conductor 10.

Each separate series of connectors 20, 21, 22 and 23 is desirably pre-formed directly on its insulating base strip 24, 25, 26 or 27 by conventional printed circuit techniques. For example, each separate connector strip can be formed by coating an insulating film with copper, depositing a protective film on the copper in the pattern desired for the connectors in that particular series, and then etching away the unprotected copper to leave only the desired pattern of connectors remaining intact on the insulating film. A longitudinal strip of the insulating film is then removed from beneath the open ends of the connectors to leave the end tabs of the connectors projecting beyond the edge of the insulating film. These techniques for forming printed circuits are, of course, well known in the art, and do not represent one of the novel features of the present invention.

While the invention has been described with specific reference to its utilization in linear sliders, it will be understood that the invention is equally applicable to rotary sliders. In rotary sliders, the U-shaped conductors are formed on a circular substrate with the elongated legs of the conductors extending along radial lines from a common centerpoint. Thus, the conductors in a rotary slider are not perfectly parallel, but they are substantially parallel because they are normally positioned relatively close to each other.

As can be seen from the foregoing detailed description, the improved harness provided by this invention permits INDUCTOSYN-type sliders to be economically manufactured with a minimum of manual labor and at high production rates. The harness can be prefabricated with very little manual labor and then connected to the entire series of conductors on the slider in a single step which takes only a few seconds. This improved harness does not require any stripping, soldering or wrapping of individual wires, and thus permits the sliders to be manufactured at a considerably lower cost than such sliders have been manufactured heretofore. All the connectors included in the harness can be simultaneously and automatically aligned with the entire series of conductors on the slider at the same time.

I claim:

1. A method of harnessing a multiplicity of substantially parallel flat U-shaped conductors on a rigid support plate to interconnect the individual conductors in two selected groups in a pattern wherein alternate conductors are in one group and intervening conductors are in the other group and wherein current flows in opposite directions in alternate conductors in each group, said method comprising the steps of
   (a) forming four separate series of thin flat U-shaped connectors for connecting the ends of the U-shaped conductors to each other in the desired groupings and pattern,
   (b) laminating the four series of connectors together with each series of connectors being separated from each adjacent series by a thin film of insulating material and with the ends of each connector projecting beyond a common edge of the insulating films,
   (c) positioning the resulting laminate on said support plate with the projecting ends of said connectors aligned with the ends of said conductors,
   (d) and fastening the projecting ends of said connectors to the corresponding ends of said conductors to interconnect said conductors in the desired groupings and pattern via said connectors.

2. A harnessing method as set forth in claim 1 wherein the projecting ends of all said connectors are simultaneously soldered to the corresponding conductors.

3. A harnessing method as set forth in claim 1 wherein a pair of registration holes are provided in said support plate and in each series of connectors to facilitate alignment of said connectors with the corresponding conductors, and a pair of pins are inserted through said holes in the laminating and positioning steps to provide said alignment.

4. A harnessing method as set forth in claim 1 wherein said series of connectors also include four connectors having ends projecting beyond the edge of said insulating film for connecting preselected conductors to two pairs of terminals.

5. A harnessing method as set forth in claim 1 wherein said U-shaped connectors are printed circuit elements.

6. A harnessing method as set forth in claim 1 wherein the projecting ends of said connectors are soldered to the ends of the corresponding conductors.

7. A harnessing method as set forth in claim 1 wherein the laminate of said four series of connectors is bonded to the same support plate that carries said conductors with each series of said connectors located on the top surface of one of said thin films of insulating material, and an insulating strip is fastened to the top of said laminate.

8. A harnessing method as set forth in claim 1 wherein each of said series of connectors is formed directly on one of said films of insulating material.

* * * * *